(12) United States Patent
Imai et al.

(10) Patent No.: US 6,845,075 B2
(45) Date of Patent: Jan. 18, 2005

(54) INFORMATION REPRODUCING APPARATUS

(75) Inventors: Mitsugu Imai, Kanagawa (JP); Junichi Horigome, Tokyo (JP)

(73) Assignee: Sony Corporation, Tokyo (JP)

( * ) Notice: Subject to any disclaimer, the term of this patent is extended or adjusted under 35 U.S.C. 154(b) by 635 days.

(21) Appl. No.: 09/894,549

(22) Filed: Jun. 28, 2001

(65) Prior Publication Data
US 2002/0012307 A1 Jan. 31, 2002

(30) Foreign Application Priority Data
Jun. 30, 2000 (JP) .................................... P2000-200032

(51) Int. Cl.$^7$ ............................................... G11B 7/00
(52) U.S. Cl. .................................................. 369/59.22
(58) Field of Search .......................... 369/59.22, 59.17, 369/59.27, 59.19, 59.12

(56) References Cited

U.S. PATENT DOCUMENTS 5,995,465 A * 11/1999 Hayashi et al. .......... 369/47.28
6,111,846 A * 8/2000 Hayashi .................. 369/124.13
6,304,538 B1 * 10/2001 Hayashi .................... 369/59.22

* cited by examiner

Primary Examiner—Nabil Hindi
(74) Attorney, Agent, or Firm—Frommer Lawrence & Haug LLP; William S. Frommer; Samuel S. Lee (57) ABSTRACT

In an information reproducing apparatus employing a maximum likelihood decoding method such as Viterbi decoding, there is a problem such that power consumption increases because a maximum likelihood decoding circuit is complicated, and many circuit elements must be used. A clock output control means is provided on a read clock transmission line of a maximum likelihood decoder, and no read clock is supplied to the maximum likelihood decoder in operation modes other than a specific operation mode when an input data is decoded by a Viterbi decoder, and thereby, it is possible to greatly reduce a power consumption. More specifically, in operation modes other than the read mode, the supply of read clock is stopped by the clock output control means based on a control signal from a controller for controlling an operation mode such as decoding or the like.

10 Claims, 11 Drawing Sheets

| M S | V M |
|---|---|
| 0 0 | V M 0 0 |
| 0 1 | V M 0 1 |
| 1 0 | V M 1 1 |
| 1 1 | V M 1 0 |

F I G. 1 3

| V M D | V M | DECODE DATA VALUE |
|---|---|---|
| 0 0 | 0 0 | 0 |
| | 0 1 | 1 |
| 0 1 | 1 1 | 0 |
| 1 1 | 1 1 | 0 |
| | 1 0 | 1 |
| 1 0 | 0 0 | 0 |

INFORMATION REPRODUCING APPARATUS

BACKGROUND OF THE INVENTION

1. Field of the Invention

The present invention relates to an information reproducing apparatus, to which a maximum likelihood decoding method such as Viterbi coding is employed. More particularly, the present invention relates to an information reproducing apparatus, which controls a clock signal supplied to a maximum likelihood decoder so that the clock signal is not supplied thereto except when it is required, and thereby, can reduce a power consumption by the maximum likelihood decoder.

2. Description of the Related Art

In recent years, various recording and reproducing methods have been studied in order to realize high-density recording with respect to a recording medium. In particular, in the field of optical disk an MSR (Magnetically Induced Super Resolution) method has been developed, and it has been expected to realize excellent high-density recording. According to the above MSR method, it is possible to reproduce information having a bit smaller and a laser spot diameter determined by a wavelength and a numerical aperture (NA) of lens.

Moreover, as a transmission method in the case of recording and reproducing a data, a partial response method positively using intersymbol interference has been developed. Thus, it is expected to realize a practical use of information reproducing apparatus employing the partial response method and the Viterbi decoding method, which is one kind of the maximum likelihood decoding methods.

Figure 1:
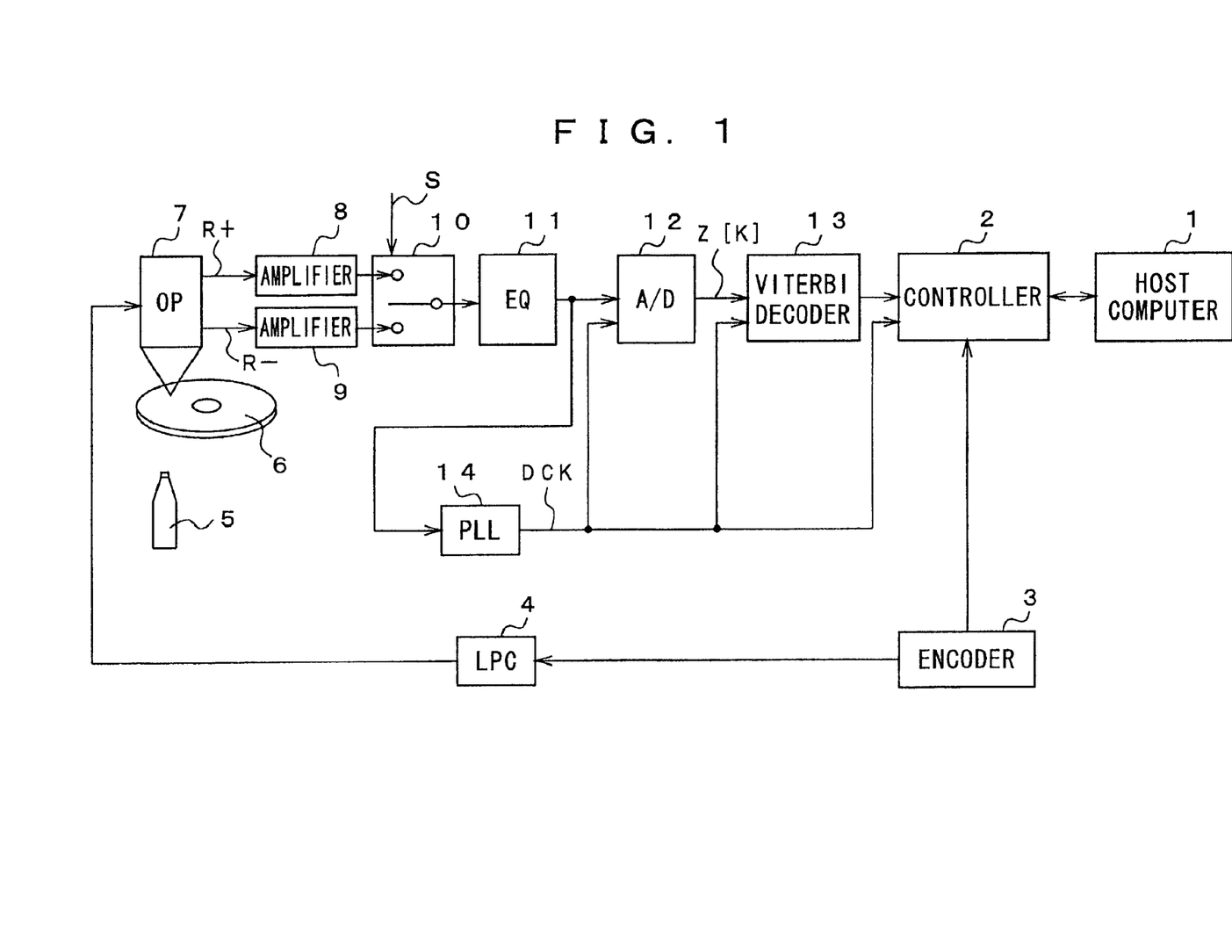
FIG. 1 is a block diagram showing a configuration of conventional receding and reproducing apparatus.

FIG. 1 is a block diagram showing the entire configuration of a conventional recording and reproducing apparatus with respect to a magnet-optical disk having a reproducing system performing Viterbi decoding.

In recording, a controller 2 receives a user data to be recorded pursuant to the instruction from the host computer 1, and then, encodes the received data based on the user data used as an information word, and therefor, generates an RLL (1, 7) code used as a code word.

In this case, the above RLL means a Run Length Limited method of limiting the number of level "0" between levels "1" and "1" in block coding. This is a coding method employed in order to secure an improvement of recording density and a stability of reproducing operation.

Then, the code word is supplied as a recording data to a laser power controller section (LPC)4. The controller 2 carries out operations such as decoding described later, control of modes such as recording, reproduction, and deletion, and exchange with the host computer 1, in addition to the processing as described above.

The laser power controller section 4 controls a laser power of optical pickup 7 in accordance with the supplied recording data so that a string of bit having a magnetic polarity is formed on a magnet optical disk 6, and thereby, performs recording. The above recording is a light intensity modulation, and a magnetic head 5 gives a bias magnetic field to the magnet optical disk 6. In fact, mark edge recording is performed according to a pre-code output generated based on the recording data, as described later.

Figure 2:
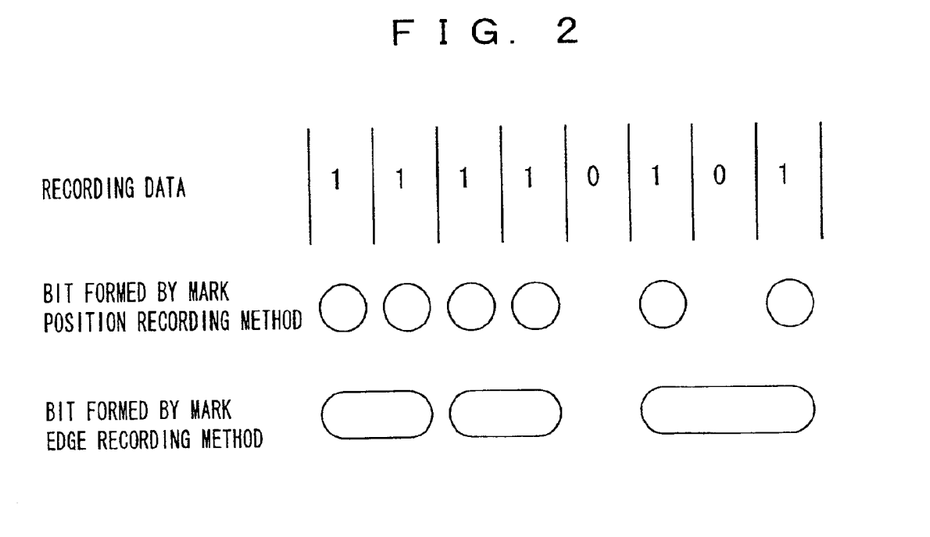
FIG. 2 is a view to explain each outline of a mark position recording method and a mark edge recording method.

To give an example of the method of recording a pre-code generated based on the recording data, as shown in FIG. 2, there is a mark position recording method such that a bit is formed with respect to "1" during pre-code output, and no bit is formed with respect to "0". On the contrary, there is a mark edge recording method such that an inversion of polarity in boundary between bits during pre-code output corresponds to "1" expressed by the edge of bit. The following description is the case where the pre-code output is recorded by the above mark edge recording method.

Next the following is a description on the configuration and operation of a reproducing system. The optical pickup 7 irradiates a laser beam to the magneto-optical disk 6, and then, receives a reflecting light generated by the irradiation so as to generate a read signal. The read signal is composed of four signals, that is, a sum signal R+, a difference signal R−, a focus error signal (not shown) and a tracking error signal (not shown).

The sum signal R+ is adjusted in its gain by an amplifier 8, and thereafter, is supplied to a changeover switch 10. The difference signal R− is adjusted in its gain by the amplifier 9, and thereafter, is supplied to the changeover switch 10. Moreover, the focus error signal is supplied to means (not shown) for correcting a focus error. The tracking error signal is supplied to a servo system (not shown), and then, is used in the operation of the servo system.

The changeover switch 10 is controlled in the following manner. More specifically, the sum signal R+ is supplied to a filter section 11 for the duration that a read signal reproduced from a magneto-optical disk formed by embossing is supplied to the changeover switch 10. On the other hand, the difference signal R− is supplied to the filter section 11 for the duration that a read signal reproduced from a magneto-optically recorded portion of the magneto-optical disk is supplied to the changeover switch 10. A changeover signal S uses a signal extracted from a sector mark having a predetermined pattern.

The above filter section 11 is composed of a low-pass filter performing a noise cut, and a waveform e performing a waveform equalization. Moreover, it is preferable to employ a characteristic adaptable to Viterbi decoding method carried out by a Viterbi decoder 13 as a waveform equalization characteristic is used in waveform equalization processing.

An output of the filter section 11 is supplied to an A/D converter 12, and then, the A/D converter 12 samples a read signal value z[k] according to a read clock DCK.

The Viterbi decoder 13 generates a decode data based on the read signal value z[k] according to the Viterbi decoding method. The decode data is the maximum likelihood decode sequence with respect to the recording data recorded in the manner as described above. Thus, in the case were there is no decode error, the decode data coincides with the recording data.

The decode data is supplied to the controller 2. The controller 2 carries out decoding corresponding to coding such as the above-described channel coding with respect to the decode data, and then, makes a data processing instruction to generate a user data.

Moreover, the output of the filter section 11 is supplied to a PLL section 14. The PLL section 14 generates a read clock DCK based on the signal thus supplied. The read clock DCK is supplied to each of the controller 2, the A/D converter 12 and the Viterbi decoder 13, and processing is performed at a timing of the read clock DCK.

Further, the read clock DCK is supplied to a timing generator (not shown). The timing generator generates a signal for controlling a device operation timing of the changeover of recording/reproducing operation.

In the above reproducing operation, in order to obtain a more correct reproduction data based on the read signal read from the magneto-optical disk 6, each operation of constituent elements of reproducing system is justified in accordance with the quality of read signal. This operation is called as calibration.

The above calibration is performed in order to justify parameters of the reproducing system. More specifically, the calibration is carried out so as to be adapted to a possibility such that the quality of read signal changes depending upon a characteristic of recording medium by machining accuracy, a variation of recording laser beam power, recording/reproducing conditions by ambient temperature.

The content of calibration is, for example, adjustment relative to the following matters; more specifically, a read laser beam power of optical pickup, a gain of amplifiers 8 and 9, a waveform equalization characteristic of the filter section 11, and an amplitude reference value used in the operation of Viterbi decoder 13, etc. The calibration is carried out by the configuration (not shown in FIG. 1) after a power is turned on or when replacing a recording medium with another recording medium.

By the way, the Viterbi decoder 13 used in the above signal processing system is composed of a branch metric unit (BMU circuit), an adder-comparator-selector circuit (ACS circuit) and a status memory unit (SMU circuit), which will be described later. More specifically, the BMU circuit calculates a branch metric between the adjacent points of time. The ASC circuit calculates a plurality of path metrics, which is the sum of the branch metric of state transition between plural points of time, and selects the maximum likelihood state transition from there. The SMU circuit generates a status data sequence.

These circuits are relatively complicated, and use many circuit elements. For this reason, it has been known that a power consumption of the Viterbi decoder 13 becomes larger than other circuit systems. Therefore, if the power consumption of the Viterbi decoder 13 is reduced as much as possible, and thereby, it is possible to reduce the entire power consumption of the magneto-optical disk drive.

SUMMARY OF THE INVENTION

The present invention has been made in order to solve the above problem in the prior art. Accordingly, an object of the present invention is to provide an information reproducing apparatus, which cuts off the supply of clock signal to a Viterbi decoder in a special mode such as data recording to a disk, and as a result, interrupts an operation of the Viterbi decoder, and thereby, can reduce power consumption.

In order to achieve the above object, according to a first aspect, the present invention provides an information reproducing apparatus, which supplies a read signal reproduced from a recording medium to a maximum likelihood decoding means, and decodes and reproduces a data, comprising:

a clock source for supplying a clock signal to the maximum likelihood decoding means;

clock control means interposed between the clock source and the maximum likelihood decoding means; and a controller for controlling an operation mode such as decoding or the like, the clock control means supplying the clock signal to the maximum likelihood decoding means in only decoding.

According to the present invention, the Viterbi decoder is used as the maximum likelihood decoder, and the read clock supplied to plural circuit systems constituting the Viterbi decoder is supplied for only the period required for Viterbi decoding. More specifically, the read clock is supplied when reproducing a data from a magnet-optical disk. In operation modes other than the above mode, for example, in a data recording mode of recording a user data in the magnet-optical disk, or in the case where the mode is in power saving mode, no decoding by the Viterbi decoder is performed in both modes. In such an operation mode, the supply of read clock is stopped based on the control signal from the controller 2.

Accordingly, no power is spent in the Viterbi decoder for the period when the supply of read clock is stopped, so that a power reduction can be achieved.

DETAILED DESCRIPTION OF THE PREFERRED EMBODIMENT

Subsequently, the preferred embodiment of the present invention will be detailed described below with reference to FIG. 2 to FIG 13. The following is a description on the case where the information reproducing apparatus of the present invention is applied to a recording and reproducing apparatus using the above magneto-optical disk.

A recording and reproducing apparatus shown in FIG. 2 of the present invention has the substantially same configuration as the conventional recording and reproducing apparatus shown in FIG. 1. The following is a brief description of the outline of data reproduction processing system. A read signal reproduced from the magneto-optical disk 6 used as a recording medium is equaled in its waveform by the filter section 11, that is, by waveform equalization of partial response PR (1, 2, 1) in this preferred embodiment. Then, the equalized read signal z[k] is converted into a digital signal (1, 0) by the A/D converter 12. The digital signal is supplied to the Viterbi decoder 13, and thereafter, a data is decoded from the maximum likelihood state transition, and thus, a decode data having the maximum likelihood decoding sequence is obtained.

Moreover, in this preferred embodiment, the read signal from the filter section 11 is supplied to the PLL circuit 14 so that a read clock DCK is generated. The read clock DCK thus generated is supplied to the A/D converter 12, the Viterbi decoder 13 and the controller 2, and then, data processing is carried out in synchronous with the read clock DCK.

According to the present invention, in this preferred embodiment, a clock output control circuit 140 is provided in a clock transmission system between an output stage of the PLL circuit 14 and the Viterbi decoder 13. The clock output control circuit 140 is controlled by gate control signals SG and SR from the controller 2.

Further, the clock output control circuit 140 controls an output state of the read clock DCK, and supplies a read clock supplied to plural circuit systems constituting the Viterbi decoder 13 for only the period required for Viterbi decoding. More specifically, the clock output control circuit 140 supplies the read clock DCK only when reproducing a data from the magneto-optical disk. In other operation modes, for example, in a data recording mode such that a user data is recorded in the magneto-optical disk, no decoding by the Viterbi decoder 13 is carried out. Therefore, in the above operation mode, the supply of read clock is stopped based on a read control signal from the controller 2.

A signal considered as the read control signal from the controller 2 is a read gate signal SG obtained when decoding the read signal as will be described later, that is, a control signal SR in a power saving mode such as a sleep mode. The control signal SR includes a signal indicative of power saving start and a signal indicative of power saving completion.

For the duration when the supply of read clock is stopped, the power by the Viterbi decoder 13 is not consumed, and thereby, a power reduction can be achieved.

Figure 3:
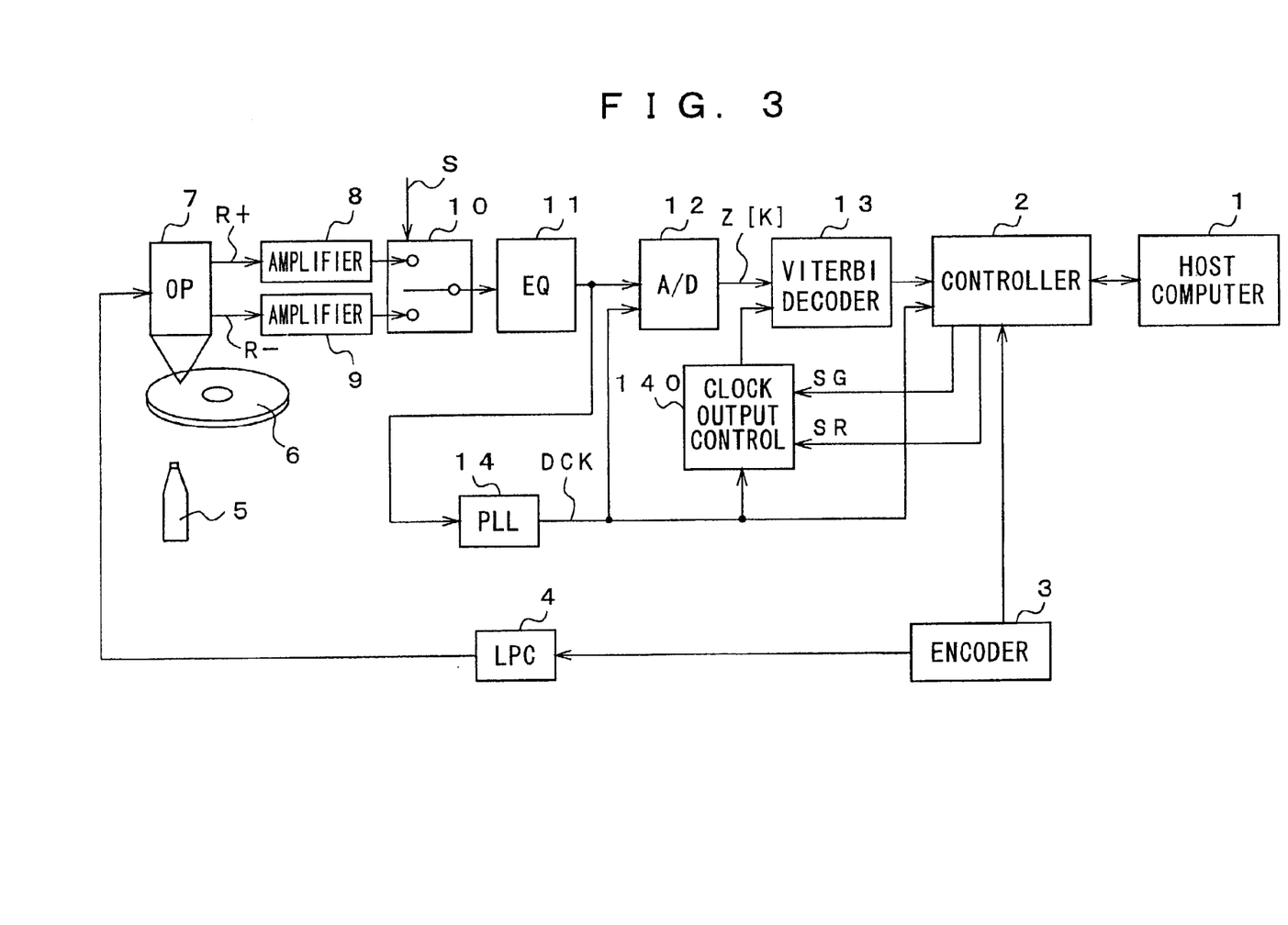
FIG. 3 is a block diagram a configuration of receding and reproducing apparatus, to which the present invention is applicable.

Subsequently, the following is a description on a Viterbi decoding method carried out by the Viterbi decoder 13. As described above, the user data is converted into a code word used as recording data by various coding (encoding) method. As the above coding method, a proper coding method is employed in accordance with a quality of recording medium and a recording/reproducing method. In the magneto-optical disk recording and reproducing apparatus shown in FIG. 3, there is employed an RLL coding method of liming the number of "0" between "1" and "1" in block coding.

The above RLL coding method can satisfy the condition required for coding method in the light of two points of improving a recording density, and securing a stability of reproducing operation.

The above RLL (1, 7) encoding method and the mark edge recording method are combined, and thereby, at least one "0" is included between "1" and "1" of the pre-code outputs generated based on the recording data, therefore, the minimum run length (RL min) becomes 2. In the case of employing the above encoding method such that the minimum run length becomes 2, it has been known that a four-value four-state Viterbi decoding method is preferable as the method of decoding a recording data from read signal receiving an influence such as intersymbol interference, noise or the like.

In waveform equalization processing performed as pre-processing of Viterbi decoding, a partial response method of positively using intersymbol interference is employed. A waveform equalization characteristic used in this case is determined in consideration of a track receding density and a Modulation Transfer Function (MTF) of recording/reproducing system. The waveform equalization processing using PR (1, 2, 1) is a pre-processing of the four-value four-state Viterbi decoding with respect to the data recorded by the combination of the above RLL (1, 7) encoding method and the mark edge recording method.

The following steps (1) to (3) show the outline of Viterbi decoding method of decoding a read signal subjected to the above waveform equalization processing.

Step (1): All likelihood states are specified based on an encoding method and a receding method with respect to a recording medium.

Step (2): Each state at a certain point of time is used as the origin, and all likelihood state transitions at the next point of time, and a recording data a [k] and a read signal value C[k] when each state transition takes place are specified.

Step (3): The state transition shown in the steps (1) and (2) is used as a premise, and the maximum likelihood state transition is selected based on a read signal z[k] after waveform equalization, reproduced in each point of time k from the recording medium.

Figure 4:
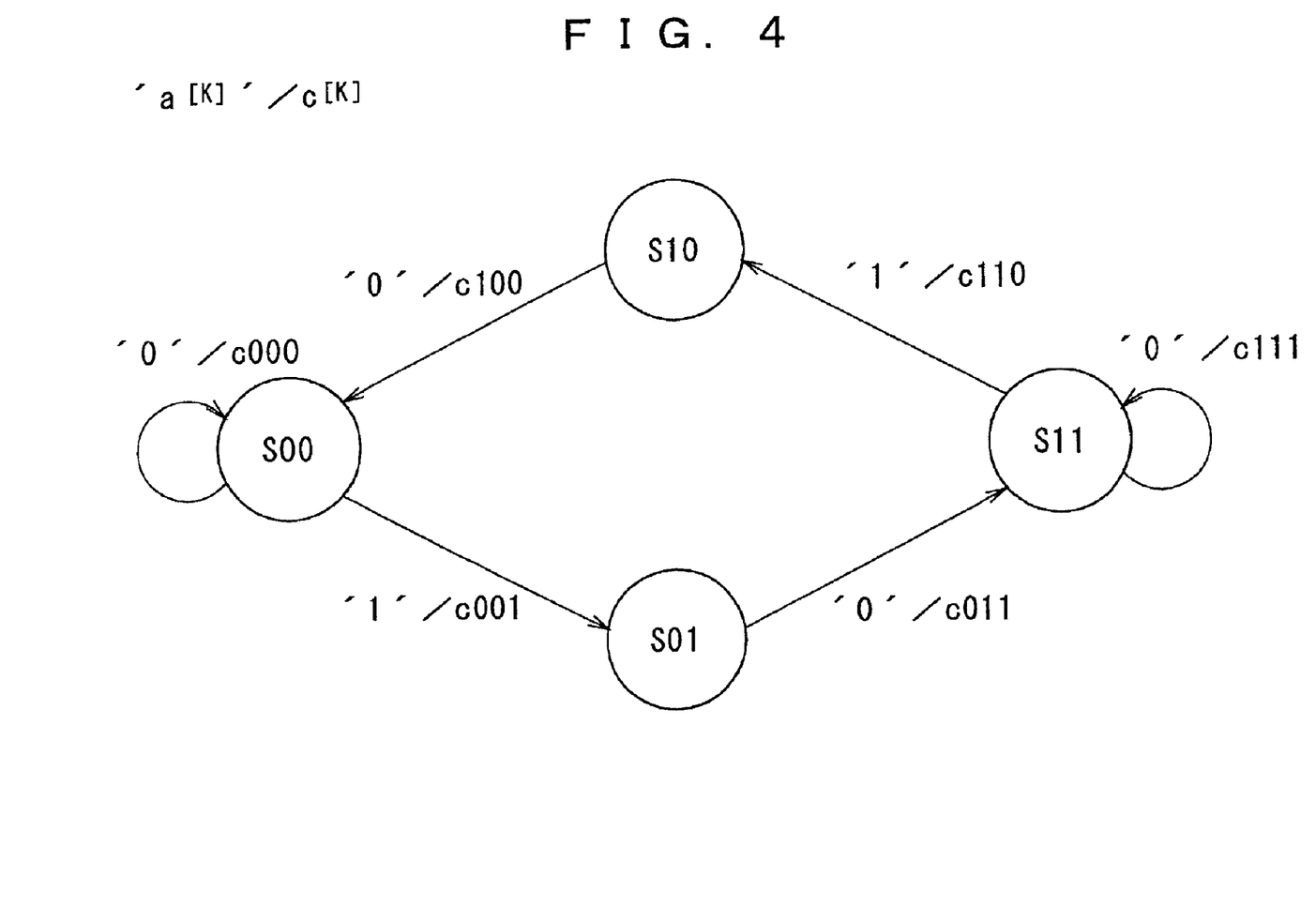
FIG. 4 is a diagram to explain a state transition of four-value four-state Viterbi decoding method.

When applying all states and state transitions specified as the result of the above steps (1) and (2) and {recording data value a [k]/read signal value Cpqr [k]} when each state transition takes place to the above four-value four-state Viterbi decoding method, a state transition diagram as shown in FIG. 4 is obtained.

In the case of the PR (1, 2, 1), an amplitude reference value used for identifying a read data becomes (0, 1, 3 and 4). Thus, p, q and r of the read signal value Cpqr determined by only calculation without considering a noise are represented by b [j−1], b [j] and b [j+1], respectively. Therefore, of the read signal value Cpqr, C000, C100 and C001, C011 and C110, and C111 shown in FIG. 4 are equivalent to "0", "1", "3" and "4", respectively. The Viterbi decoder 13 carries out decoding based on the state transition diagram of FIG. 4.

In the step (3), the maximum likelihood state transition is selected based on the read signal z[k] after waveform equalization reproduced from the recording medium at each point of time k. Every when the maximum likelihood state transition is selected, the selected state transition is generated as a state (status) data using the state data value representing the state. By referring to a decoding table from the state data, a decode data having the maximum likelihood decode value sequence is obtained.

The decode data is not obtained from the above state data, but it is possible to generate a decode data having a decode data value sequence in accordance with the maximum likelihood state transition selected based on the read signal value. In this case, the Viterbi decoder 13 caries out decoding using a path memory unit (PMU).

Figure 6:
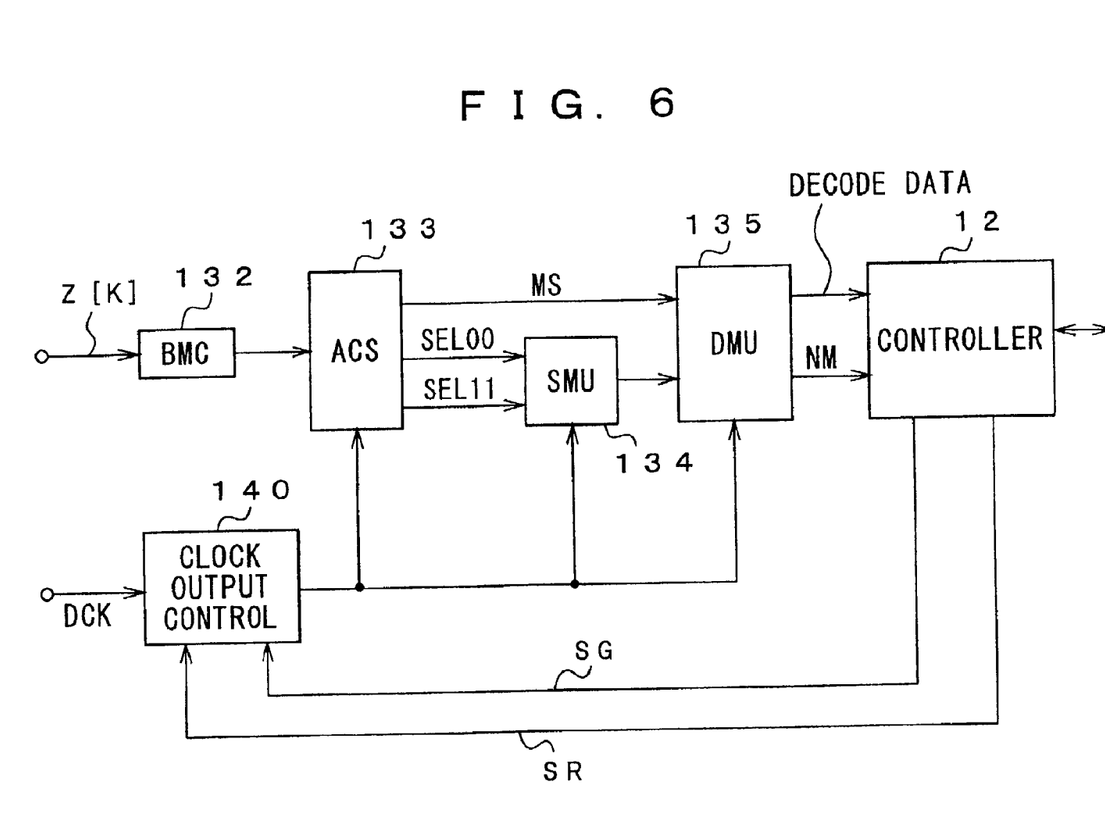
FIG. 6 is a block diagram showing principal parts of a Viterbi decoder according to one embodiment of the present invention.

The Viterbi decoder 13 used for achieving the above decoding has a configuration as shown in FIG. 6. As seen from the later description, the Viterbi decoder 13 is composed of a branch metric circuit (BMC circuit) 132, an adder-comparator-selector circuit (ACS circuit) 133, a status memory block (SMB circuit) 134 and a data merge block (DMB circuit) 135. More specifically, the BMC circuit 132 calculates a branch metric, and the ACS circuit 133 calculates and selects a new path metric. The SMB circuit 134 is used for storing a status data, and the DMB circuit 135 is used for obtaining a final decode data.

When the read clock DCK is supplied to each of these elements, the entire operation timing of the Viterbi decoder 13 is matched. According to the present invention, a clock output control circuit 140 is provided in addition to these elements as described above. The clock output control circuit 140 controls the Viterbi decoder 13 so that the Viterbi decoder 13 is operated in only necessary operation mode. The details will be described later.

Now, in the above Viterbi decoding the state transition diagram shown in FIG. 4 is used as a premise, and then, the maximum likelihood state transition is selected from the actual read signal z[k] including a noise.

In order to select the maximum likelihood state transition, there is a need of calculating a path metric of state transitions between plural points of time in the state process, with respect to a state at a certain point of time k. By making a comparison with the calculated path metric, the maximum likelihood decode sequence is selected.

In order to calculate the path metric, a branch metric of state transitions between adjacent points of time k and k-1 is calculated. For this reason, a certain state is considered as Sa in the point of time k-1. In this case, in the case where the read signal z[k] is inputted to the Viterbi decoder 13, it has been known that a branch metric when a state transition to the state Sb takes place is calculated from the following equation(1). The states Sa and Sb are any of four states (S00, S10, S01, S11) shown in the state transition diagram of FIG. 4.

$$(z[k]-Cpqr)^2 \qquad (1)$$

In the equation (1) above, Cpqr is the read signal value shown in the state transition diagram of FIG. 4 in the state transition from the certain state Sa to the state Sb. Thus, the equation (1) above is a Euclid distance between the actual read signal value z[k] including a noise and a read signal Cpqr calculated without considering the noise.

Figure 5:
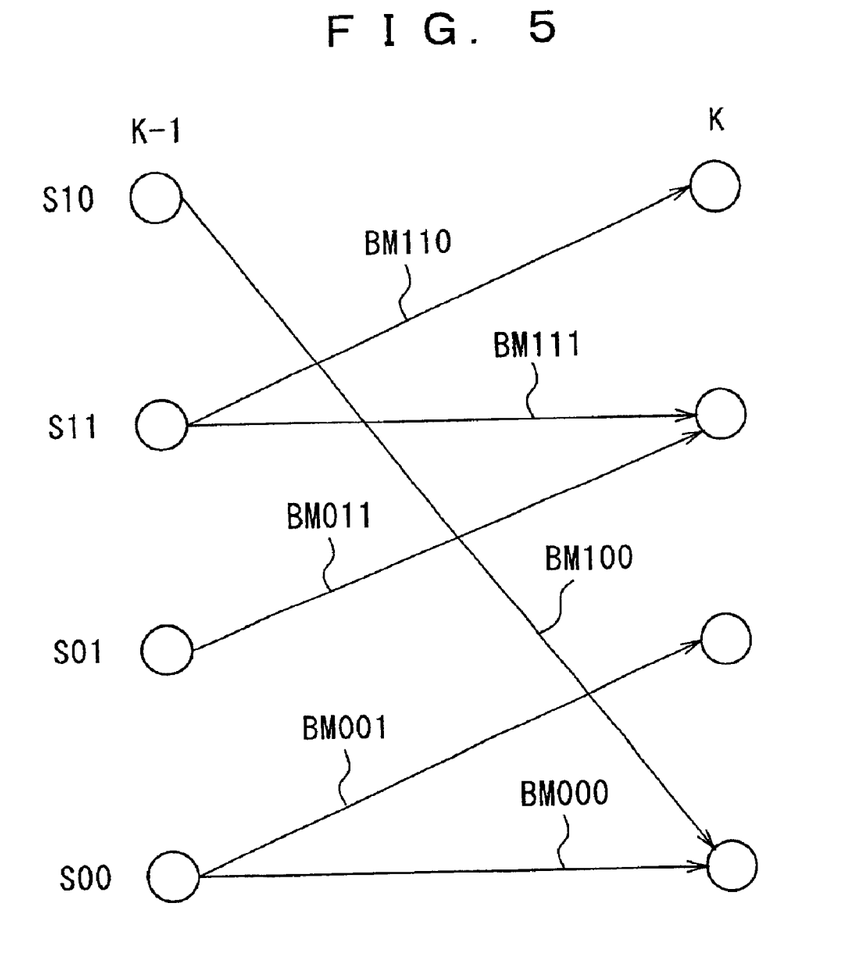
FIG. 5 is a trellis diagram showing the state transition shown in FIG. 4.

The branch metric is calculated by the BMC circuit 132. As seen from FIG. 4, there are six state transitions; in this case, six branch metrics BM as shown in FIG. 5 must be calculated. Therefore, the BMC circuit 132 calculates the branch metrics in the following manner.

$$BM000 = (z[k]-C000)^2$$
$$BM001 = (z[k]-C001)^2$$
$$BM011 = (z[k]-C011)^2$$
$$BM110 = (z[k]-C110)^2$$
$$BM100 = (z[k]-C100)^2$$
$$BM111 = (z[k]-C111)^2$$

Then, the calculated result of branch metric based on the read signal z[k] is supplied to the ACS circuit 133.

Next, a path metric Mij[k] at the point of time k is the total path metric of adjacent points of time up to the point of time k. For this reason, the ACS circuit 133 calculates a new path metric from the branch metric calculated by the BMC circuit 132 and a stored path metric in accordance with each state. Moreover, in the case where a certain state is a state Sa at the point of time k, there is the case where a state at the point of time k-1 (state shiftable to the state Sa) exists plural. In FIG. 4, this state is equivalent to states S00 and S11. In such a case, the minimum path metric is selected from the path metrics calculated with respect to each state. Therefore, the ACS circuit 133 makes the following calculation. In this case, a path metric up to the point of time [k-1] is expressed as Mij[k-1].

$$M10[k] = M11[k-1] + BM110$$
$$M11[k] = \min\{(M11[k-1]+BM111), (M01[k-1]+BM011)\}$$
$$M01[k] = M00[k-1] + BM001$$
$$M00[k] = \min\{(M00[k-1]+BM000), (M10[k-1]+BM100)\}$$

In this case, the path metric is calculated so as to select the maximum likelihood state transition, and besides, there exists a method of selecting the maximum likelihood state transition using a simple calculating method, however, no reference is made to this method.

In order to perform the above processing, the ACS circuit 133 is composed of plural path metric adder circuits, comparator circuits and a state (status data) selector circuits, although these circuits are not shown.

To give an example of the above processing, the ACS circuit adds the branch metric BM000 corresponding to the state S00→S00 and the path metric M10 updated before one clock together, and thereby, calculates the total path metric in the case where the latest transition is S10→S00.

Likewise, the ACS circuit adds the branch metric BM100 corresponding to the state S00→S00 and the path metric M00 updated before one clock together, and thereby, calculates the total path metric in the case where the latest transition is S00→S00.

Then, the ACS circuit 133 compares two total path metrics thus calculated, and selects the maximum likelihood state transition. The total path metric corresponding to the selected state transition is latched as the updated path metric M00 value, and then, a select signal SEL00 corresponding to the selective result is outputted.

The above processing is carried out for each state so as to obtain four updated path metrics M00, M01, M10 and M11, and then, the minimum path metric of these path metrics is supplied as a 2-bit signal MS to the DMU circuit 135. The select signal is two, that is, SEL00 and SEL11, and these select signals are supplied to the after-stage SMU circuit 134.

Figure 8:
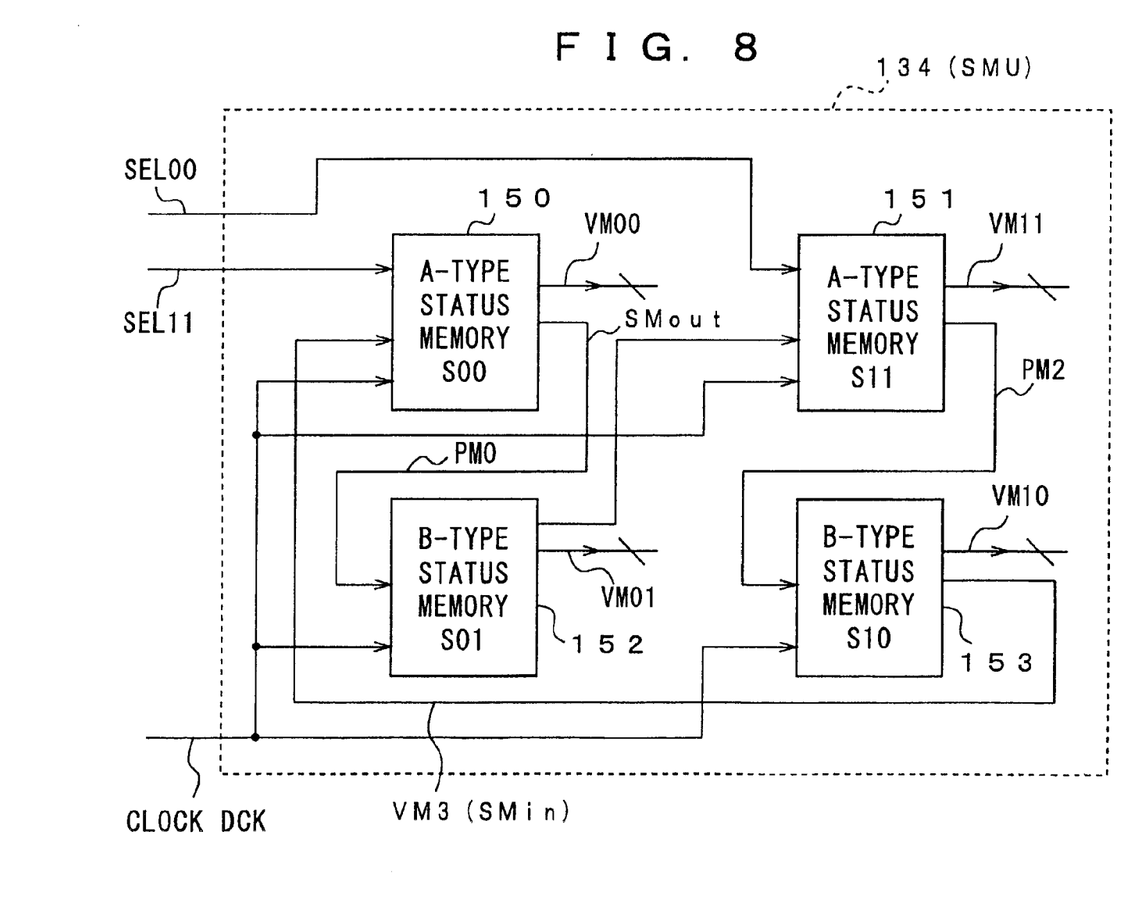
FIG. 8 is a block diagram showing a configuration of SMU circuit of a disk recording and reproducing apparatus according to one embodiment of the present invention.

Next, the following is a description on the SMU circuit 134. As shown in FIG. 8, the SMU circuit is composed of four status memories. A-type status memories 150 and 151 correspond to states S00 and S11, respectively. B-type status memories 152 and 153 correspond to states S01 and S10, respectively. These four status memories are mutually connected according to the state transition diagram of FIG. 4.

Figure 9:
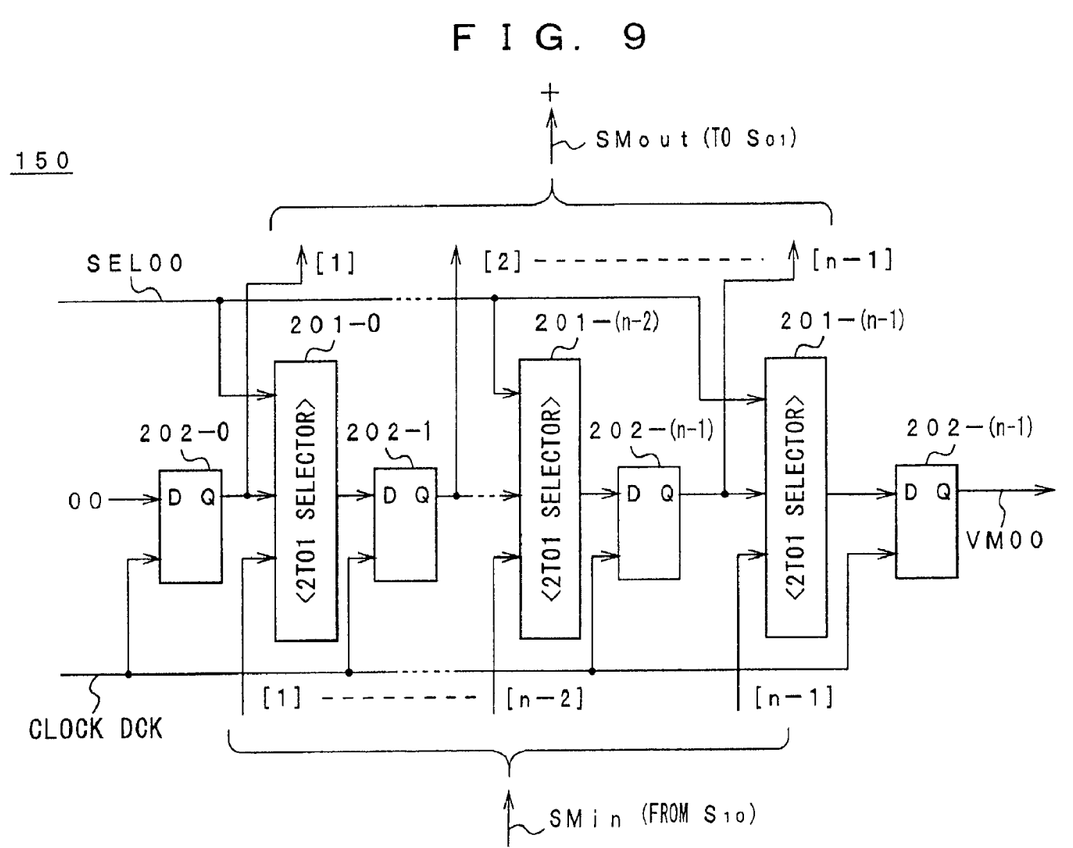
FIG. 9 is a block diagram showing a configuration of an A-type status memory of the SMU circuit of the disk recording and reproducing apparatus according to one embodiment of the present invention.

The A-type status memory 150 corresponding to the state S00 will be described below with reference to FIG. 9. As shown in FIG. 9, the A-type status memory 150 is constructed in a manner that n selectors 201-0 to 201-(n-1) and n registers 202-0 to 202-(n-1) are alternately connected.

The select signal SEL00 is supplied to each of the selectors 201-0 to 201-(n-1). A status data inherited from the B-type status memory 153 corresponding to the state S10 is supplied as SMin comprising bits to each selector.

Moreover, a status data inherited from the B-type status memory 152 corresponding to the state S01 is outputted as SMout comprising n-1 status data value to each selector.

As shown in FIG. 4, the shiftable state before one clock in the state S00 is either of the states S00 and S10. When the state before one clock is S00, a transition inheriting the state itself is performed. For this reason, a data "00" is inputted to the first-stage selector 201-0 as the latest status data of status data generated by a serial shift.

Thus, the latest status data value SMin [1] of the status data supplied from the B-type status memory 153 is supplied as a parallel road to the selector 201-0. Then, the selector 201-0 supplies one of these two status data to the after-stage register 202-0.

Further, the selectors 201-1 to 201-(n-1) after the two-stage individually receive two data as a parallel road. More specifically, the above two data include one status data supplied from the B-type status memory 153 corresponding to the state S 10, and one status data supplied from the pre-stage register as a serial shift. Then, from these two status data, a status data value determined as the maximum likelihood is supplied to the after-stage register according to the select signal SEL00. All of the selectors 201-0 to 201-(n-1) are operated according to the identical select signal SEL00; therefore, it is possible to inherit a status data having the maximum likelihood status data value sequence selected by the ACS circuit 133.

Moreover, the registers 202-0 to 202-(n-1) fetch the status data value supplied in the above-described manner according to clock, and thereby, update their holding status data value. As described above, an output of each register is supplied to a status memory corresponding to a shiftable state one clock. More specifically, the state is shiftable to the state S00 itself; therefore, the output is supplied to the after-stage selector as a serial shift. Further, the output is supplied as a parallel road to the B-type status memory 152 corresponding to the state S01. A status data value VM00 is outputted from the final-stage register 202-(n-1).

The A-type status memory 151 corresponding to the state S11 has the same configuration as the A-type status memory 150. In this case, however, a status data is supplied as parallel road corresponding to the state transition S01→S11 of FIG. 4 from the B-type status memory 152 corresponding to the state S01. Further, status data is supplied as a parallel road corresponding to the state transition S11→S10 of FIG. 4 from the B-type status memory 153l corresponding to the state S10.

Figure 10:
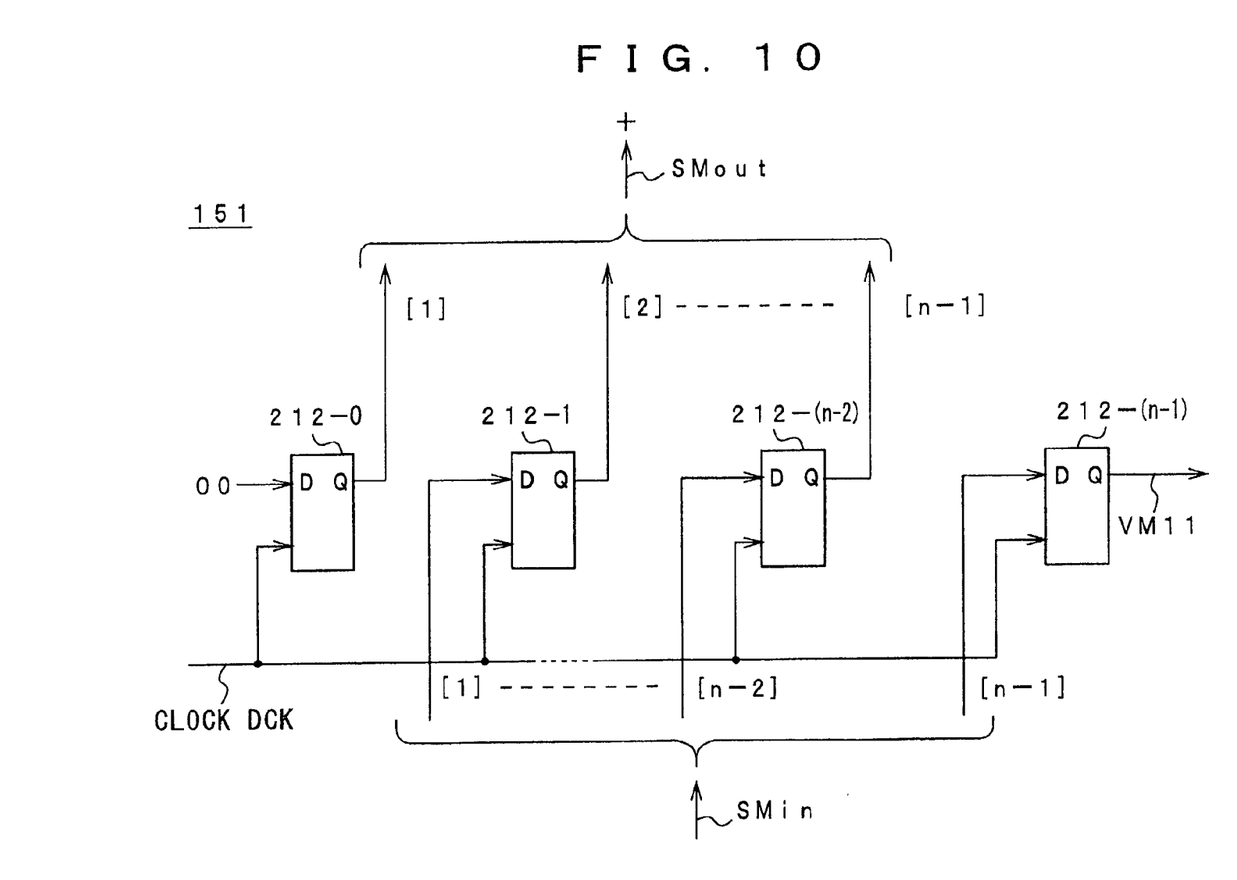
FIG. 10 is a block diagram showing a configuration of a B-type status memory of the SMU circuit of the disk recording and reproducing apparatus according to one embodiment of the present invention.

Next, the B-type status memory 152 corresponding to the state S01 will be detailed described below with reference to FIG. 10. The B-type status memory 152 is constructed so as to correspond to a state such that the state itself is not inherited and a shiftable state after one clock is only one (i.e., states S10 and S01). For this reason, no serial shift is performed, and the B-type status memory 152 is provided with no selector. Therefore, the B-type status memory 152 is provided with n registers 212-0 to 212-(n-1), and a clock is supplied to each register so that the operation timing is synchronized.

A status data inherited from the A-type status memory 150 corresponding to the state S00 is supplied as SM into the registers 212-0 to 212-(n-1). In this case, however, a data "00" is always inputted to the register 212-0, which is the first processing stage, in synchronous with clock This operation corresponds to the event that the latest state transition shiftable to the state S01 is always the state S00, as shown in FIG. 4. The registers 212-0 to 212-(n-1) fetch the supplied status data value according to clock, and thereby, update their holding status data.

The output from each register made according to clock is supplied as a status data SMout comprising n-1 status data value to the A-type status memory 151 corresponding to the state S11 shiftable after one clock. A status data value VM01 is outputted from the final-stage register 212-(n-1).

The B-type status memory 153 corresponding to the state S10 has the same configuration as the B-type status memory 152. In this case, however, a status data is supplied as a parallel road corresponding to the state transition S11→S10 of FIG. 4 from the A-type status memory 151 corresponding to the state S11.

A status data is supplied as a parallel road corroding to the state transition S10→S00 of FIG. 4 from the A-type status memory 150 corresponding to the state S00. Moreover, a data "11" is always inputted to the register, which is the first processing stage, in synchronous with clock This operation corresponds to the event that the latest state transition shiftable to the state S10 is always the state S11, as shown in FIG. 4.

By the way, in the Viterbi decoding method, the status data values generated by the status memories may be substantially correspondent to each other. However, in the case where the signal quality of read signal is reduced, there is the case where four status data VM00, VM11, VM01 and VM10 are not correspondent to each other. If the above non-correspondence takes place, the most suitable status data value is selected. The data merge unit circuit (MLT) 135 includes a select processing block when the non-correspondence takes place.

Figure 11:
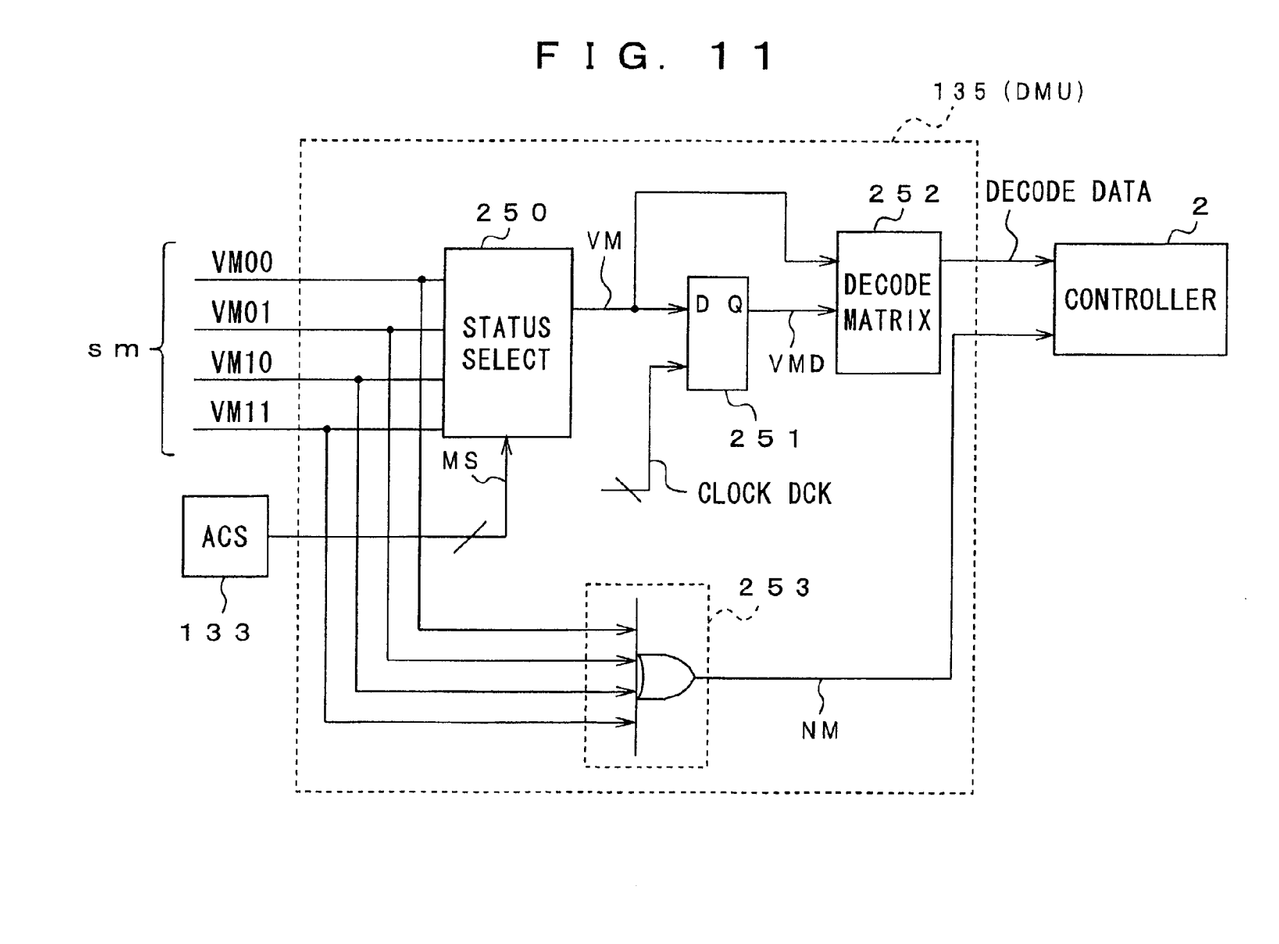
FIG. 11 is a block diagram showing a configuration of DMU circuit of a disk recording and reproducing apparatus according to one embodiment of the present invention.

Next the DMU circuit 135 will be described below with reference to FIG. 11. The DMU circuit 135 includes a status select circuit 250, a register 251, a decode matrix section 252 and a non-correspondence detecting circuit 253. More specifically, the sus select circuit 250 selects the most suitable status data from the status data value VM00, VM11, VM01 and VM10 supplied from the SMU circuit 134 at a timing according to the read clock DCK. The register 251 delays an output of the status select circuit 250 for one clock. The non-correspondence detecting circuit 253 detects non-correspondence of the status data values VM00, VM11, VM01 and VM10.

Figure 12:
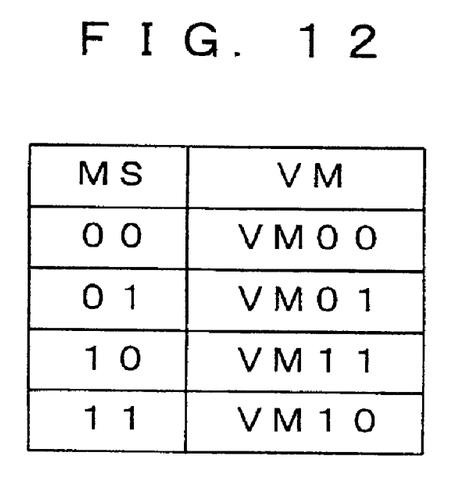
FIG. 12 is a view to explain a status data value selecting operation in a merge block according to one embodiment of the present invention.

The status select circuit 250 refers to a 2-bit signal MS supplied from the ACS circuit 133, and then, selects the most suitable status data from the status data value VM00, VM11, VM01 and VM10, and thereafter, outputs the selected status data value as VM. In this case, the status select circuit 250 selects the status data value VM as shown in FIG. 12.

The status data value VM selected in the above manner is supplied to the register 251 and the decode matrix section 252. The register 251 delays the supplied status data value VM for one clock, and then, supplies it to the decode matrix section 252. In the following description, the output of the register 251 is expressed as VMD.

Therefore, the status data value VM and the status data value VMD before one clock are supplied to the decode matrix section 252. The decode matrix section 252 outputs a decode data based on the status data values VM and VMD according to a decode matrix (decode table) shown in FIG. 13. The decode matrix may be stored in the form of a ROM table or hardware.

Figure 13:
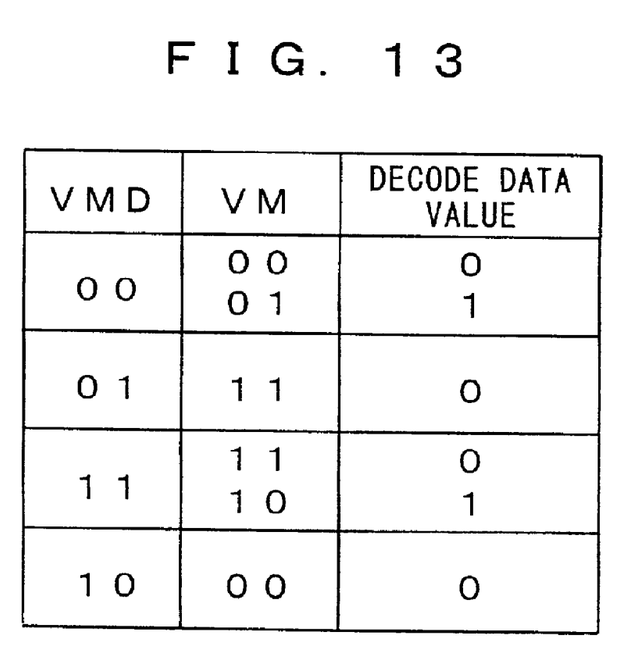
FIG. 13 is a view to explain a table referred when a decode data is generated by the merge block according to one embodiment of the present invention.

The following is a description on the decode matrix shown in FIG. 13. As seen from the state transition diagram of FIG. 4, a decode data value corresponds to two continuous status data values VM. For example, in the case where the status data value VM at the time t is "01" and the status data value VDM at the time t-1 before one clock is "00", the decode data value corresponds to "1". FIG. 13 shows a table in which the above correspondence is summarize.

On the other hand, the non-correspondence detecting circuit 253 comprising an exclusive logical product circuit detects non-correspondence between four status data values VM00, VM11, VM01 and VM10. Then, the detection result is supplied as a non-correspondence detection signal NM to the controller 2, and is counted. According to the counted result, the reliability of decode data and the quality of read signal is evaluated.

In the present invention, as shown in FIG. 6, the read clock DCK is supplied to the clock output control circuit 140. The clock output control circuit 140 controls the read clock DCK supplied to the circuit system of the Viterbi decoder 13.

The read clock DCK is supplied as an operation clock to all circuit systems constituting the above Viterbi decoder 13. However, no read clock DCK is supplied as the operation clock in operation modes other than data read mode.

Figure 7:
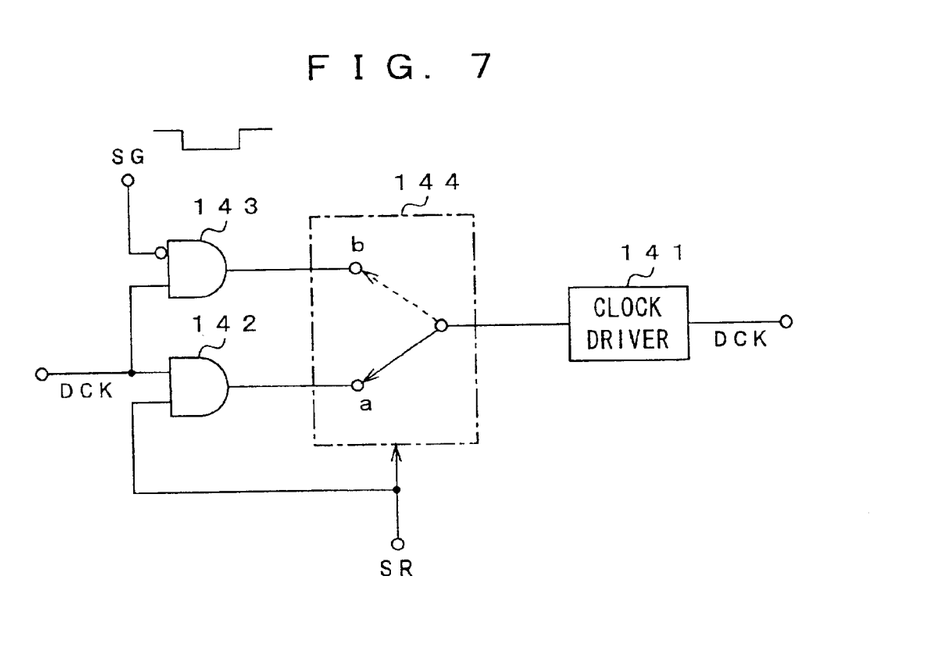
FIG. 7 is a diagram showing a configuration of clock output control circuit according to one embodiment of the present invention.

As shown in FIG. 7, the clock output control circuit 140 may be constructed as switching means 144, which is composed of first and second logical product circuits 142 and 143 and a transistor, in addition to the clock driver 141. A control signal SR generated in power saving mode is outputted from the controller 2, and then, is supplied to the switching means 144. A contact point is changed into a terminal b side by the control signal SR (e.g., high level) of power saving mode. When the power saving mode is cancelled, the contact point is changed into a terminal a side by a low-level control signal SR.

The read clock DCK is supplied in common to the logical product circuits 142 and 143, and then, a read gate signal SG from the controller 2 is supplied to the first logical product circuit 143. The read clock DCK is supplied to the Viterbi decoder 13 for the period when the read gate signal SG is at a low level.

Even in the power saving mode, the read gate signal SG is supplied by the control signal SR. Therefore, the read gate signal SG is supplied to the first logical product circuit 143 when a read request of read signal is made from the controller 2; as a result, it is possible to operate the Viterbi decoder 13 for that period.

As shown in FIG. 8, the Viterbi decoder 13 is composed of a great many of circuit elements including the SMU circuit 134; therefore, the number of components considerably increases. For this reason, a power consumption of the Viterbi decoder 13 considerably increases. The Viterbi decoder 13 is operated in only data read mode, and thereby, it is possible to greatly reduce the power consumption by the Viterbi decoder 13. According to an experiment, it was found that the power consumption by the Viterbi decoder 13 is reduced approximately 20 to 30% as compared with the case where the read clock DCK is always supplied to the Viterbi decoder 13.

The above embodiment has described the case where the present invention is applied to the magneto-optical disk performing the four-value four-state Viterbi decoding method. The present invention may be applicable to the magneto-optical disk performing other Viterbi decoding methods such as three-value four-state Viterbi decoding method, seven-value six-state Viterbi decoding method, etc.

Moreover, the present invention is applicable to various information reproducing apparatuses, which can employ the Viterbi decoding method for decoding a read data from a read signal reproduced from a read recorded in a recording medium. More specifically, the present invention is applicable to magnet optical disk drives such as a phase change optical disk such as a DVD, a remarkable disk such as a CD-W (CD-Rewritable), a write-once disk such as a CD-R (CD-WO), a read-only disk such as a CD-ROM, in addition to the magneto optical disk (MO).

APR (1, 3, 3, 1) may be used as waveform characteristic; in this case, when an RLL (1, 7) code is used as recording data, seven-value six-state Viterbi decoding method is employed.

As is evident from the above description, according to the present invention, the clock output control circuit is provided on a read clock transmission line of a maximum likelihood decoder, and no read clock is supplied to the maximum likelihood decoder in operation modes other than a specific operation mode. The specific operation mode is a mode Hen an input data is decoded by the maximum likelihood decoder.

Moreover, according to the present invention, the supply of read clock to the maximum likelihood decoder is stopped in operation modes other than the specific operation mode; therefore, all of plural circuit systems constituting the maximum likelihood decoder are in a state of being not operated. As a result, no power consumption is spent in these circuit systems. By doing so, it is possible to greatly reduce the power consumption by the maximum likelihood decoder as compared with the case where the read clock DCK is always supplied to the maximum likelihood decoder. According to an experiment, it is possible to realize a 20 to 30% power reduction. Therefore, the present invention has the constituent features of realizing an information reproducing apparatus, which can reduce a power consumption.

What is claimed is:

1. An information reproducing apparatus, which supplies a read signal reproduced from a recording medium to a maximum likelihood decoding means, and decodes and reproduces a data, comprising:

a clock source for supplying a clock signal to the maximum likelihood decoding means;

clock control means interposed between the clock source and the maximum likelihood decoding means; and a controller for controlling an operation mode such as decoding or the like, the clock control means supplying the clock signal to the maximum likelihood decoding means in only decoding, the clock control means including:
a clock driver;
switching means provided on a pre-stage of the clock driver; and
two logical product circuits provided on a pre-stage of the switching means,
wherein the clock signal is supplied in common to the two logical product circuits.

2. The information reproducing apparatus according to claim 1, wherein the maximum likelihood decoding means is a Viterbi decoder.

3. The information reproducing apparatus according to claim 2, wherein when the maximum likelihood decoding means is a Viterbi decoder, waveform equalization means for the read signal is provided on a pre-stage of the Viterbi decoder.

4. The information reproducing apparatus according to claim 3, wherein the waveform equalization characteristic is a partial response characteristic.

5. The information reproducing apparatus according to claim 4, wherein a PR (1, 2, 1) characteristic is used as the partial response characteristic PR.

6. The information reproducing apparatus according to claim 4, wherein a PR (1, 3, 3, 1) characteristic is used as the partial response characteristic PR.

7. An information reproducing apparatus, which supplies a read signal reproduced from a recording medium to a Viterbi decoder, and decodes and reproduces a data, comprising:
- a clock source for supplying a clock signal to the Viterbi decoder;
- clock control means interposed between the clock source and the Viterbi decoder; and
- a controller for controlling an operation mode such as decoding or the like,
- the clock control means supplying the clock signal to the Viterbi decoder in only decoding,
- wherein the Viterbi decoder includes:
  - a branch metric circuit for calculating a branch metric from a read signal;
  - an adder-comparator-selector circuit for adding the branch metric and a path metric, and selecting a transition state; a status memory block for holding a selected status data; and
  - a data merge block for decoding the read signal from the status data.

8. The information reproducing apparatus according to claim 1, wherein the read signal is a signal from a magneto-optical disk.

9. The information reproducing apparatus according to claim 1, wherein the clock source is a PLL circuit to which the read signal is supplied.

10. An information reproducing apparatus, which supplies a read signal reproduced from a recording medium to a maximum likelihood decoding means, and decodes and reproduces a data, comprising:
- a clock source for supplying a clock signal to the maximum likelihood decoding means;
- clock control means interposed between the clock source and the maximum likelihood decoding means; and
- a controller for controlling an operation mode such as decoding or the like,
- the clock control means supplying the clock signal to the maximum likelihood decoding means in only decoding,
- the clock control means including:
  - switching means provided on a pre-stage of the clock driver; and
  - two logical product circuits provided on a pre-stage of the switching means,
  - wherein the clock signal is supplied in common to the two logical product circuits, and
- wherein a read gate signal obtained from the controller is supplied to a first logical product circuit of first and second logical product circuits, and a control signal indicative of a power saving mode state and generated by the controller is supplied to the second logical product circuit and the switching means.

* * * * *